United States Patent [19]

Burke

[11] Patent Number: 5,248,929

[45] Date of Patent: Sep. 28, 1993

[54] BATTERY TIME MONITOR FOR CELLULAR TELEPHONE

[75] Inventor: Timothy M. Burke, Plano, Tex.

[73] Assignee: Murata Machinery, Ltd., Kyoto, Japan

[21] Appl. No.: 876,102

[22] Filed: Apr. 30, 1992

[51] Int. Cl.⁵ .................................. H01M 10/48
[52] U.S. Cl. ........................... 320/48; 320/13; 320/43
[58] Field of Search ............... 320/13, 43, 44, 48; 324/426, 427, 435; 340/636

[56] References Cited

U.S. PATENT DOCUMENTS

| 3,778,702 | 12/1973 | Finger | 320/48 X |
|---|---|---|---|
| 4,380,726 | 4/1983 | Sado et al. | 320/48 |
| 4,525,055 | 6/1985 | Yokoo | 320/48 X |
| 4,638,237 | 1/1987 | Fernandez | 320/48 |
| 5,032,825 | 7/1991 | Kuznicki | 320/48 X |
| 5,043,651 | 8/1991 | Tamura | 320/43 |
| 5,065,084 | 11/1991 | Oogita | 320/48 |
| 5,115,182 | 5/1962 | Ehmke et al. | 320/14 |
| 5,130,659 | 7/1992 | Sloan | 320/48 X |

OTHER PUBLICATIONS

Info World, vol. 14, pp. 10-11, Apr. 6, 1992.

Primary Examiner—Kristine L. Peckman
Attorney, Agent, or Firm—Spensley Horn Jubas & Lubitz

[57] ABSTRACT

A battery monitoring system for a cellular telephone which provides the user with a real time display of the amount of time remaining for use of the cellular telephone in both the standby and conversation modes. The amount of time may be calculated directly from the rate of discharge of the battery or from stored conversion factors corresponding to various states of charge of the battery.

1 Claim, 2 Drawing Sheets

BATTERY TIME MONITOR FOR CELLULAR TELEPHONE

BACKGROUND OF THE INVENTION:

1. Field of the Invention

One embodiment of the present invention is directed to a battery time monitoring system for a cellular telephone. More particularly, one embodiment of the present invention is directed to a battery time monitor for a cellular telephone which provides the user with visual feedback as to the amount of time remaining for operation of the cellular telephone so that the user may determine how long the next call can last before the battery is discharged.

2. Description of Related Art

Cellular telephones are rapidly becoming commonplace. Indeed, in many fields a cellular telephone is almost a necessity. As cellular telephone technology advances, the size of cellular telephones is constantly shrinking to the point where cellular telephones can fit in the palm of the hand or a shirt pocket. However, one of the major problems associated with small, hand held cellular telephones is the availability of battery storage capacity for the operation of the telephone. Thus, it is often a prime concern for the user of a hand held cellular telephone to know the state of charge of the batteries in the cellular telephone.

While many cellular telephones provide an indication of the battery charge state and/or level, it is difficult for the user of a cellular telephone to convert the state of the battery into meaningful information (e.g. such as whether the battery charge state is sufficient to allow the user of the telephone to make an additional cellular telephone call, to determine the length of the call that can be made, or to determine the amount of time remaining that the user can receive calls).

An example of a battery capacity indicating system is described in U.S. Pat. No. 5,032,825 to Kuznicki entitled "Battery Capacity Indicator." In the '825 patent, a system is provided which indicates the amount of capacity remaining in the battery. However, the system described the useful battery life available does not indicate or determine the amount of remaining time for device operations. That is, the system described in the '825 patent does not give any indication to the user of a device having such a battery capacity indicating system in it how much time is available to utilize the device. Thus, although the battery capacity indicator in the '825 patent provides the user with a continuous display of the available battery capacity, such information is often of little practical value to the user of the device.

Accordingly, there is a need for a system which provides a real time display to the user of a battery operated device, based on the stored energy in the battery, of the useful battery life available.

SUMMARY OF THE INVENTION

It is an object of the present invention to solve the aforementioned problems associated with the prior art and to provide for a battery time monitor for a cellular telephone which provides a visual feedback to the phone user of the remaining battery capacity by displaying the amount of time remaining for operation. The real time display in accordance with one embodiment of the present invention provides the user with the remaining operation time for both a standby mode and conversation mode of operation for the cellular telephone.

By providing a real time display of the remaining operation time for the cellular telephone (standby and conversation), the user of the cellular telephone can instantly know not only the status of the battery charge in the cellular telephone but how long the next call can last before the battery discharges.

The present invention, which is best defined by the claims appended to this disclosure, will be more fully understood when considered in the light of the detailed discussion below taken in conjunction with the drawings.

DESCRIPTION OF THE PREFERRED EMBODIMENT

Figure 1:
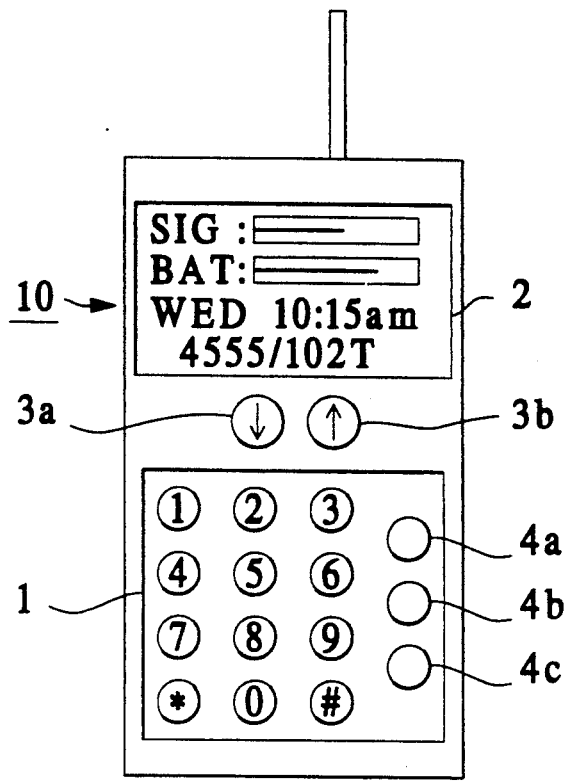
FIG. 1 illustrates one embodiment of the present invention in which a hand held cellular telephone having a display which indicates the status of the battery charge as well as the amount of remaining standby and conversation time.
Figure 2:
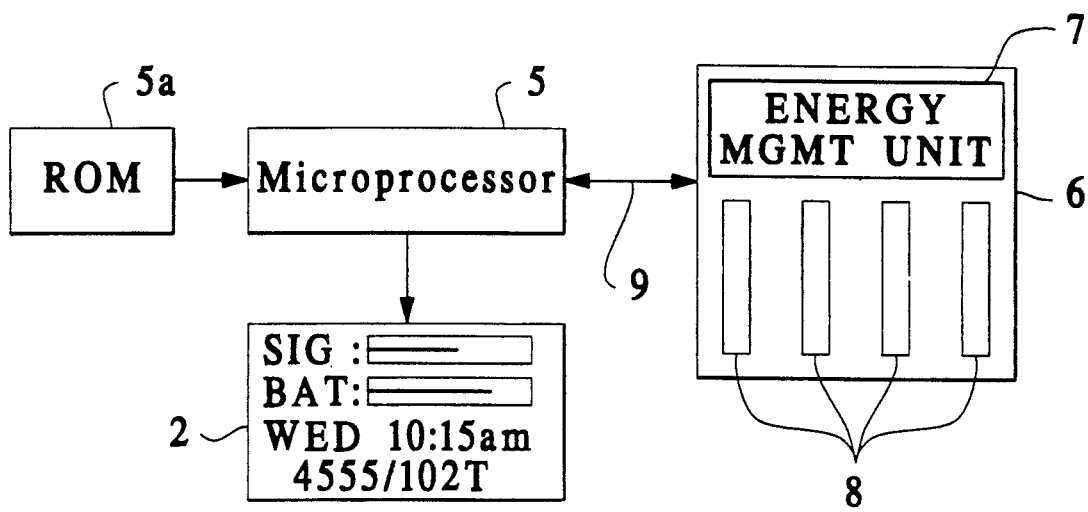
FIG. 2 is a schematic representation of a circuit for producing the display on the hand held cellular telephone shown in FIG. 1.

FIGS. 1 and 2 illustrate a preferred embodiment of the present invention. These figures are not to be considered in a limiting sense, but are merely provided to illustrate a preferred embodiment. The invention is best defined by the claims appended to this description.

FIG. 1 shows a hand held cellular telephone 10 having a keypad 1, a display 2 and scroll keys 3a and 3b. The function of the scroll keys may be similar to that described in U.S. patent application No. 07/876.103, entitled PC- LINK FOR CELLULAR TELEPHONE which was filed on even date herewith. As illustrated in FIG. 1, the display 2 may display the current status of the battery charge. In addition, the display can illustrate the amount of remaining standby time (i.e. the time available to receive phone calls) and the amount of time available to utilize the hand held cellular telephone 10 in a conversation mode. As can be seen in FIG. 1, in the example illustrated there are 455 minutes of standby time and 102 minutes of conversation time remaining.

The display 2 illustrated in FIG. 1 need not be constantly displayed if the hand held cellular telephone 10 is being maintained in a standby mode. Constantly displaying the information illustrated in FIG. 1 would, of course, result in a faster drain on the batteries. Accordingly, it may be possible to utilize one of the miscellaneous keys 4a-4c to display the battery level when such information is desired (as one skilled in the art would readily understand, hand held cellular telephones generally have a plurality of keys which are utilized for such functions as power on/off, send, end, etc., however to simplify the illustrations, such keys are not shown).

FIG. 2 provides schematic illustration of an example of a circuit for producing the display illustrated in FIGURE Referring to FIG. 2, the display 2 is driven by a microprocessor 5. Preferably, the microprocessor may be a hand held microprocessor HC 11 manufactured by Motorola, Inc. The microprocessor 5 can be connected by way of a serial bus 9 to an energy management unit 7 which monitors the state of the battery cells 8 in the battery module 6. The energy management unit 7 may preferably be a bq2001 Energy Management Unit manufactured by Benchmarq Electronics.

In the illustrated embodiment, the energy management unit 7 can perform various battery functions such as, for example, recharging and capacity monitoring. The microprocessor 5 can interrogate the energy management unit 7 at any time to determine the amount of remaining charge in the battery module 6. The information received from the energy management unit 7 can be stored in registers within the microprocessor 5. The status of the batteries obtained from the energy management unit 7 may then be converted into both standby time and conversation time using stored estimates of power consumption when operating in these modes. The conversion function may be similar to the "miles to empty" display in an automobile where the gas gauge reading is used in conjunction with the average fuel efficiency to determine the number of miles available for driving with the current amount of fuel in the tank.

The calculation of remaining time can be dynamically estimated by the amount of power consumption (or current drain with a fixed voltage). The power consumption for various operating modes can be measured and stored for the microprocessor in order to make these calculations. For example, the microprocessor can be provided with a ROM such as 5a which can store the necessary power consumption data for various operating modes.

Alternatively, the actual current drain on the battery in the hand held cellular telephone 10 can be measured. The value of the actual current drain, which would be an analog figure, can be converted utilizing an analog to digital converter and then stored in a memory (e.g. a RAM) in the hand held cellular telephone 10. Thus, a history of the current drain for each operating mode in the hand held cellular telephone 10 can be developed so that the microprocessor 5 can utilize this "history" to provide a dynamic estimate of the amount of remaining battery time for both standby and conversation modes.

Figure 3B:
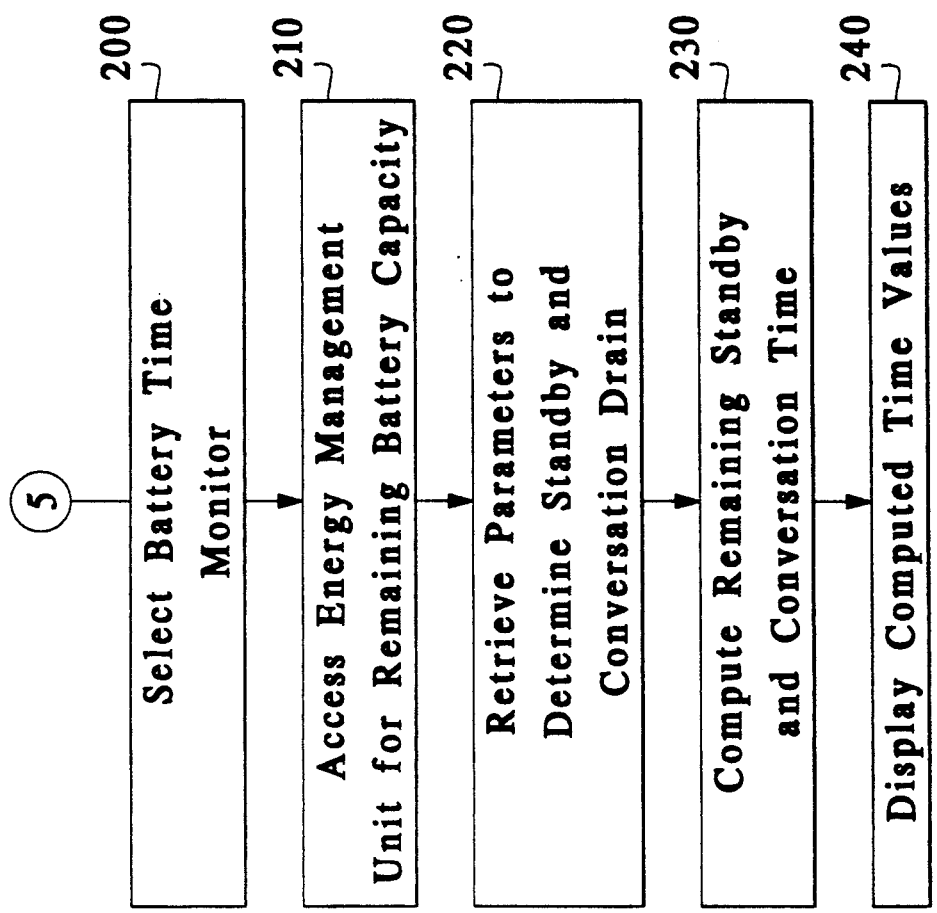
FIGS. 3A and 3B illustrate a flow diagram of possible routines for monitoring the status of the battery and displaying information to the user of the cellular telephone illustrated in FIG. 1.
Figure 3A:
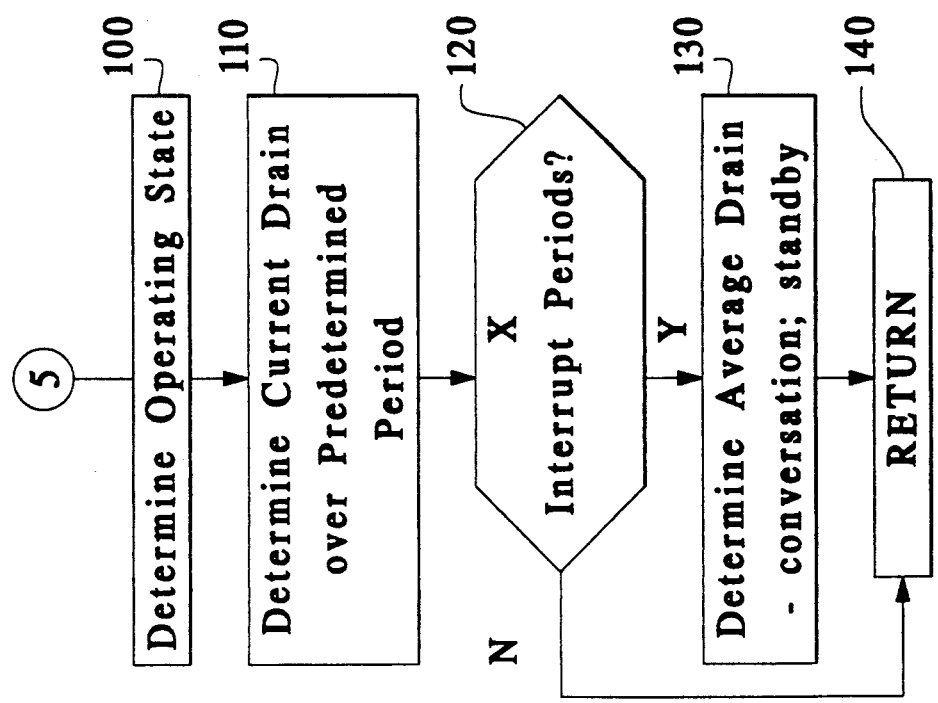

FIGS. 3A and 3B illustrate one example of a routine which may be utilized by the microprocessor for monitoring the status of the batteries in the cellular telephone 10 and displaying the information to the user of the cellular telephone. The illustrated routine adapts to the user usage profile and provides an estimate of the amount of time remaining for operation of the cellular telephone in both the standby and conversation modes. FIG. 3A illustrates a routine for updating the average usage parameters of the cellular telephone 10 and for providing an estimate of the amount of current drain that will be required during standby and conversation modes. The display routine, illustrated in FIG. 3B, takes data provided by the update routine illustrated in FIG. 3A and converts the information to a user friendly format for displaying the remaining standby time and the remaining conversation time for the cellular telephone 10.

Referring to FIG. 3A, FIG. 3A illustrates an interrupt routine which is executed by the microprocessor 5 illustrated in FIG. 2. The microprocessor 5 is programmed to perform the interrupt routine on a regular basis, for example, every 100 milliseconds.

During the program interrupt, the microprocessor 5 executes the interrupt routine illustrated in FIG. 3A. As illustrated, in step 100 the microprocessor 5 determines the operating mode of the cellular telephone 10. After the operating mode of the cellular telephone is determined, the microprocessor 5 determines the current drain over a predetermined period of time in step 110. That is, the microprocessor 5, based on the present operating state of the cellular telephone 10 (e.g., conversation or standby), uses a table of current drain figures corresponding to the present operating state of the cellular telephone 10 to determine the current drain. The table of current drain figures may be stored, for example, in the ROM 5a. These figures are predetermined based on actual measured data for each possible operating state over an interval which equals the interrupt interval of the microprocessor.

For example, if the interrupt time is 100 milliseconds, the figures in the ROM table will be measured for each possible operating state of the cellular telephone 10 over a 100 millisecond interval. Each operating mode, such as conversation, will have several operating states with varying degrees of current drain. Accordingly, the tables will contain information for each of the operating modes over the given interval.

The current drain information determined by the microprocessor 5 is stored, for example, in a RAM not shown. The microprocessor 5 accumulates the current drain information for each of the operating modes of the cellular telephone. This information, as illustrated in FIG. 3A in step 120, is accumulated over a period of time equal to X interrupt periods. X will be determined based upon the interrupt interval and the resolution of the usage display.

As illustrated in FIG. 1, the resolution of the display 2 in terms of the battery usage information is minutes. Accordingly, with an interrupt interval of 100 milliseconds, the microprocessor 5 would accumulate battery usage information over a total of 600 interrupt periods in order to provide the resolution of one minute of displayable battery usage information.

In step 130, the microprocessor 5 determines the average drain in both the conversation and standby modes for the cellular telephone 10. A running average is computed for each of the two major modes by taking the total accumulated current drain and dividing by, for example, the 60 second time base. The result is an average power consumption (or current drain) per one minute interval (milliamp/minute). The result may be stored in a RAM, which preferably would be a nonvolatile RAM memory, for use by the display routine which will be discussed below with reference to FIG. 3B.

On start up, the RAM-based variables will contain a worst case-figure which is also predetermined and stored in the ROM 5a. Accordingly, when a user of the cellular telephone 10 initially starts up the cellular telephone and requests a display of the battery information, the user will be provided with a worse case scenario as to the remaining battery capacity. Later, upon the acquiring of usage history through the above-discussed routine, the figures displayed to the user will be updated accordingly.

The display routine illustrated in FIG. 3B can be entered whenever the cellular telephone is powered up or whenever the user presses the appropriate "battery monitor" key on the phone keyboard. For example, the cellular telephone 10 could utilize one of the miscellaneous keys 4a-4c as a "battery monitor" key which, upon being pressed, would cause the execution of the display routine illustrated in FIG. 3B.

As illustrated in FIG. 3B, the display routine is selected at step 200 by either powering up of the cellular telephone 10 o by the selection of the display routine through the use of the appropriate "battery monitor" key. In step 210, the microprocessor 5 will address the energy management unit 7 contained within the battery housing 6. The energy management unit 7 provides an accurate account of the available battery charge capacity which may be translated into an "energy remaining" figure or the total amount of current available for use by the phone electronics. In step 220, the microprocessor 5 will retrieve parameters to determine the standby and conversation drain. That is, the microprocessor 5 will access the average conversation drain and average standby drain parameters which were stored in the RAM as discussed above with respect to the usage routine illustrated in FIG. 3A. Next, in step 230, the remaining standby and conversation times are computed. That is, the available battery current (e.g. milliamps) is divided by the usage rate (e.g. milliamps/minute) to yield the number of minutes available for each of the operating modes of the cellular telephone.

In step 240, the computed time values are displayed on the display 2 of the cellular telephone 10. The number of remaining minutes for standby operation and conversation operation are displayed. Further, in accordance with another embodiment of the present invention, the user may change the display format to indicate either minutes or hours (with fractions) of remaining time.

Clearly, routines other than those illustrated in FIGS. 3A and 3B could be incorporated in the cellular telephone 10 of the present invention. For example, a "hybrid" remaining time that displays a single time figure based on a user's usage history could be provided. Also, the time period used to determine the phone usage rate (i.e. the interrupt interval) may be extended or shortened to obtain better estimates. The routines illustrated in FIGS. 3A and 3B could be applied to other battery operated devices, such as lap top computers, where the user would like to know the amount of remaining operating time.

While the battery time monitoring system described above has been disclosed for use in conjunction with a cellular telephone, it should be readily apparent to those skilled in the art that the battery time monitoring circuit may also be used with any personal communications device, laptop computer, or other electronic device, which requires monitoring of battery operations.

Although the present invention has been described in terms of a preferred embodiment above, numerous modifications and/or additions to the above-described preferred embodiment would be readily apparent to one skilled in the art. It is intended that the scope of the present invention extends to all such modifications and/or additions and that the scope of the present invention is limited solely by the claims set forth below.

We claim:

1. In a cellular telephone having a first mode of operation and a second mode of operation and including a battery defining a state of charge, a device for monitoring the state of charge of the battery, the device comprising:

measuring means for substantially continuously measuring the state of charge of the battery and for generating a charge value corresponding to the state of charge of the battery, storage means for storing the charge value, determining means, responsive to the storage means, for using the charge value to determine a first amount of time remaining for use of the battery in the first mode of operation and a second amount of time remaining for use of the battery in the second mode of operation, and display means, responsive to the determining means, for providing a real time display of the first amount of time remaining and the second amount of time remaining, whereby the device provides a dynamic indication of the amount of time remaining for use of the battery in the first mode of operation and the amount of time remaining for use of the battery in the second mode of operation.

* * * * *